United States Patent [19]
Lee et al.

[11] Patent Number: 5,584,117
[45] Date of Patent: Dec. 17, 1996

[54] METHOD OF MAKING AN INTERFEROMETER-BASED BOLOMETER

[75] Inventors: Shih-ping Lee; Chi-Nan Chen, both of Hsin-chu, Taiwan

[73] Assignee: Industrial Technology Research Institute, Hsinchu, Taiwan

[21] Appl. No.: 570,061

[22] Filed: Dec. 11, 1995

[51] Int. Cl.$^6$ .............................. H01C 17/06; H01J 4/00
[52] U.S. Cl. ................. 29/620; 29/592.1; 250/338.1; 216/16; 356/352; 338/18
[58] Field of Search .................. 29/620, 592.1; 216/16; 250/338.1, 353; 338/18; 356/352

[56] References Cited

U.S. PATENT DOCUMENTS

| | | | |
|---|---|---|---|
| 4,574,263 | 3/1986 | Liddiard | 338/18 |
| 5,130,259 | 7/1992 | Bahrman | 437/5 |
| 5,171,994 | 12/1992 | Bahrman | 250/332 |
| 5,286,976 | 2/1994 | Cole | 250/349 |
| 5,300,915 | 4/1994 | Higashi et al. | 338/22 |
| 5,367,167 | 11/1994 | Keenan | 250/338.4 |
| 5,369,280 | 11/1994 | Liddiard | 250/370.08 |
| 5,426,412 | 6/1995 | Tomonari et al. | 338/18 |
| 5,500,761 | 3/1996 | Goossen et al. | 257/415 |

*Primary Examiner*—P. W. Echols
*Attorney, Agent, or Firm*—George O. Saile

[57] ABSTRACT

An infrared detector device is described. It is based on an infrared analog of the Fabry Perot interferometer, using one curved, fully reflecting, plate and one planar, mainly reflecting, but partially transmitting, plate. The space between these plates behaves as a resonant cavity which can be built to respond to either a broad or a narrow band of wavelengths in the general range between 1 and 15 microns. It is also possible to combine several detectors of different narrow bands in a single device. Actual detection of the radiation is based on use of thin film resistors, having a high thermal coefficient of resistance, that are thermally isolated from the other parts of the structure. Details relating to the manufacture of the devices are given.

13 Claims, 5 Drawing Sheets

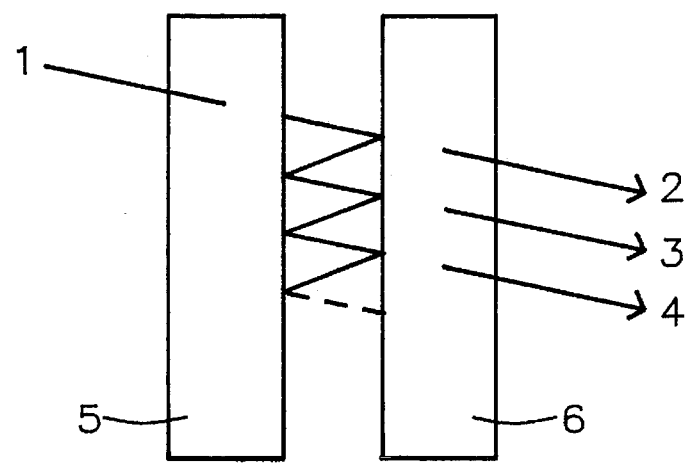
*FIG. 1 - Prior Art*
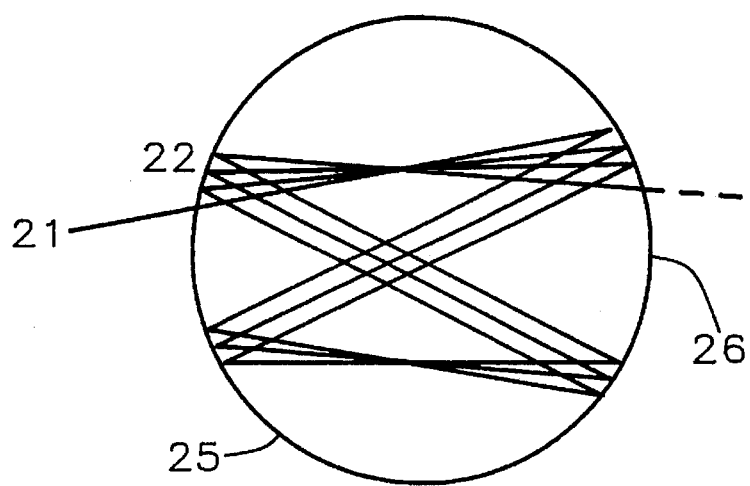
*FIG. 2 - Prior Art*

METHOD OF MAKING AN INTERFEROMETER-BASED BOLOMETER

BACKGROUND OF THE INVENTION

1. Field of the Invention

The invention relates to the general field of infrared detectors, more particularly to the use of tuned cavities.

2. Description of the Prior Art

FIG. 1 is a schematic diagram of a Fabry Perot interferometer. Its basic components are a pair of transparent plates 5 and 6, spaced a few millimeters apart, whose inner surfaces have been coated with a thin film of metal which reflects almost all of a light beam that may be incident upon it but does transmit a small proportion thereof. Typically about 90% of the light is reflected and about 10% is transmitted, absorption being negligible.

Thus about 10% of light beam 1, entering the system at other than normal incidence, will enter the inter-plate cavity where it will be successively transmitted and reflected at both of the inner surfaces. It is readily seen that the transmitted beams that emerge on the far side of plate 6 (designated 2,3,4 in FIG. 1) are all coherent relative to each other and adjoining beams differ in phase from one another by the same amount. If such beams are caused to converge by means of a lens (not shown, but located to the right of plate 6) they will form interference fringes, dark where they were out of phase, light where they reinforced one another.

Interferometers of the type illustrated in FIG. 1 can have very high resolving power but they are very sensitive to a number of factors. These include the reflectivity and optical finish of the surfaces involved and establishment and maintenance of parallelism. Additionally, small variations in optical path length within the cavity that may result from temporary or permanent inhomogeneities of the material contained in the cavity, must be avoided.

A number of these problems are removed or mitigated if the plates of the interferometer are concave, as illustrated in FIG. 2. Light beam 21 enters the cavity by passing through partially reflecting surface 25. After making four passes back and forth between the two concave surfaces it has reached region 22, which is approximately its point of entry. After four more passes it is back at 22 again, and so on. This arrangement of two concave plates need not be perfectly aligned to still function. Nor is it as sensitive to external vibration as the parallel plate version.

An optically equivalent version of the double concave structure can be constructed by using a single concave plate in conjunction with a planar mirror. A virtual image of the concave surface is created by the planar mirror so a light beam will end up in the same spot within the cavity after every eight passes. An interferometer of this type forms the subject matter of the present invention and may be looked at as a resonant cavity in the microwave sense.

We are not aware of any prior art relative to infrared radiation detectors that is based on the use of a resonant cavity. Cole (U.S. Pat. No. 5,286,976 February 1994) teaches a detector that is partly transparent to infrared and is backed up by a mirror so it receives additional input from the reflected beam, making it, in effect, a two pass cavity. This is not, however, a resonant cavity and Cole's detector is sensitive over a wide range of infrared wavelengths. The present invention, by contrast, is based on an eight pass resonant cavity and, for a given geometry, is sensitive to only a narrow band of wavelengths.

Liddiard (U.S. Pat. No. 4,574,263 March 1986) also provides a mirror to increase the sensitivity of the detector, but notes that said mirror is optional and not key to the invention (which it is in the present invention).

SUMMARY OF THE INVENTION

It has been an object of the present invention to provide a device that may be tailored to detect, with a very high level of sensitivity, any chosen narrow band of infrared radiation in the general wavelength range from 1 to 15 microns.

A further object of the present invention has been to provide a device that is able to detect, with a high level of sensitivity, a wide range of infrared wavelengths in the general wavelength range from 1 to 15 microns.

Yet another object of the present invention is to provide a device that is capable of detecting, simultaneously, radiation in any of several chosen narrow bands of infrared radiation in the general wavelength range from 1 to 15 microns.

Still another object of the present invention has been to provide an efficient method for manufacturing said devices.

These objects have been achieved by means of design that is based on an infrared analog of the Fabry Perot interferometer, using one curved, fully reflecting, plate and one planar, mainly reflecting, but partially transmitting, plate. The space between these plates behaves as a resonant cavity which can be built to respond to either a broad or a narrow band of wavelengths in the general range between 1 and 15 microns. It is also possible to combine several detectors of different narrow bands in a single device. Actual detection of the radiation is based on use of thin film resistors, having a high thermal coefficient of resistance, that are thermally isolated from the other parts of the structure. Manufacture of the devices has been achieved through application of a variety of techniques commonly in use for micro-machining.

BRIEF DESCRIPTION OF THE DRAWINGS

FIG. 1 is a schematic representation of a classical Fabry Perot interferometer.

FIG. 2 shows a modification of the Fabry Perot interferometer that uses curved rather than planar plates.

FIG. 3b is a plan view of part of FIG. 3a.

DESCRIPTION OF THE PREFERRED EMBODIMENTS

Figure 3A:
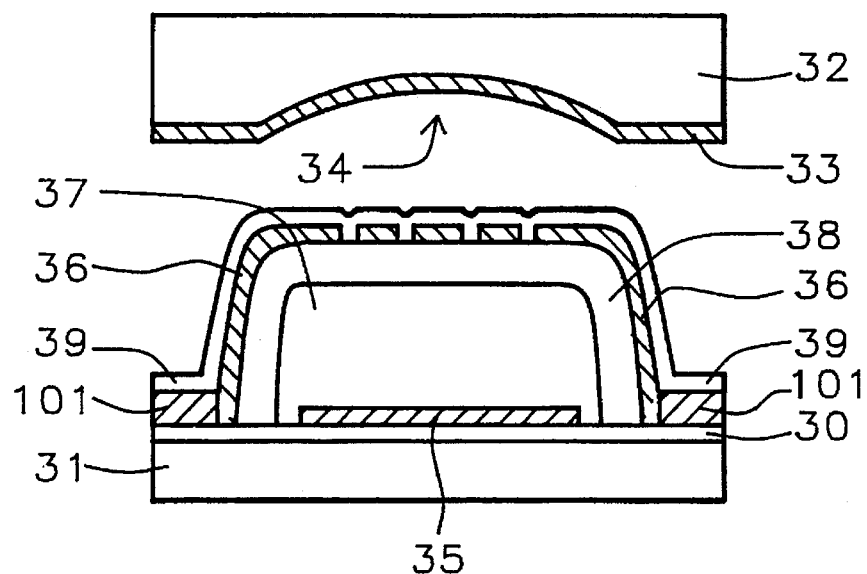
FIG. 3a shows the basic elements that comprise the present invention.

FIG. 3a shows two silicon plates 31 and 32. They may be separated by anything from about 10 to about 100 microns. Silicon is the material of choice since it is transparent to infrared radiation over the wavelength range 1–15 microns, with little or no variation in refractive index. Top plate 32 has a planar upper surface. Its lower surface is also initially planar but a concave depression, concavity 34, having a radius of curvature between about 15 and 50 microns, has been formed in its surface.

Bottom silicon plate 31 has two surfaces, the upper one being optically flat while the lower surface has a roughness value between about 10 to 50 microns. This roughness is needed to eliminate the possibility of resonant cavities being formed between the top and bottom surfaces of 31 and/or the bottom surfaces of 31 and 32. The thickness of the plates may range from about 0.2 to 0.5 mm., with 0.45 mm. being typical. The lower surface of top plate 32, including the concavity, is coated with a layer of metal 33 such as aluminum to a thickness between about 0.5 and 1.3 microns, 1 micron being typical, sufficient to make surface 33 essentially totally reflective of infrared in the 1–15 micron range. The upper surface of plate 31 is coated with layer 35 of a metal such as tungsten, molybdenum, or gold to a thickness between about 40 and 75 nanometers, 50 being typical, designed to give a reflectance of at least 99%, in the 1–15 micron range, with essentially no absorption.

A temperature sensitive device 36, typically a thin film resistor comprising chromium or titanium oxide, is permanently mounted a short distance above layer 35 and is thermally isolated from said plate. The method and structure used to accomplish this will be described later. Four spacers (not shown) are formed around detector 36. Plate 32 is then brought into contact with said spacers and sealed to them, forming a cavity (also not shown here) which is large enough to encompass concavity 34. Said cavity is then evacuated just prior to sealing.

Figure 3B:
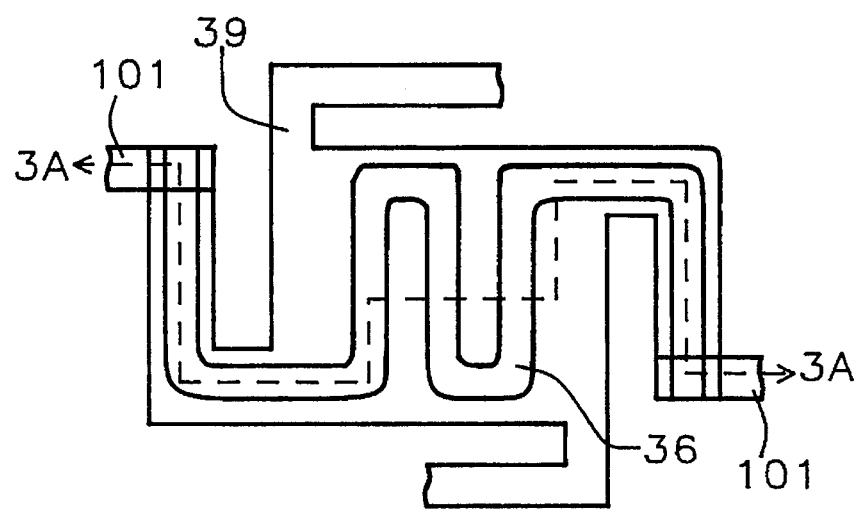
Figure 4:
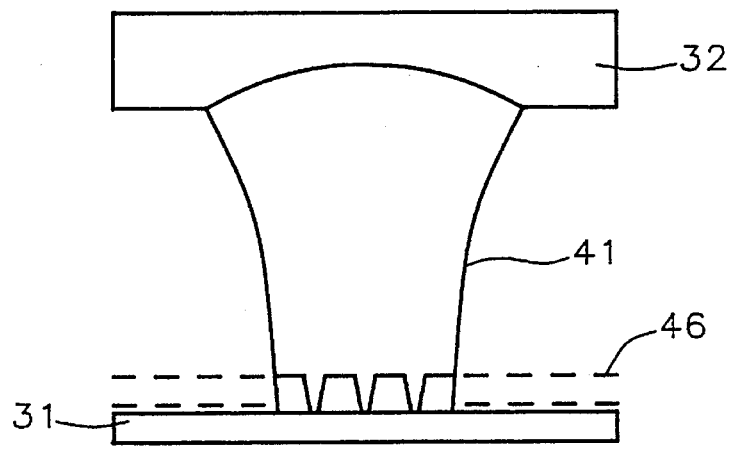
FIGS. 4 and 5 show the distribution of radiation inside the resonant cavity of the present invention.
Figure 5:
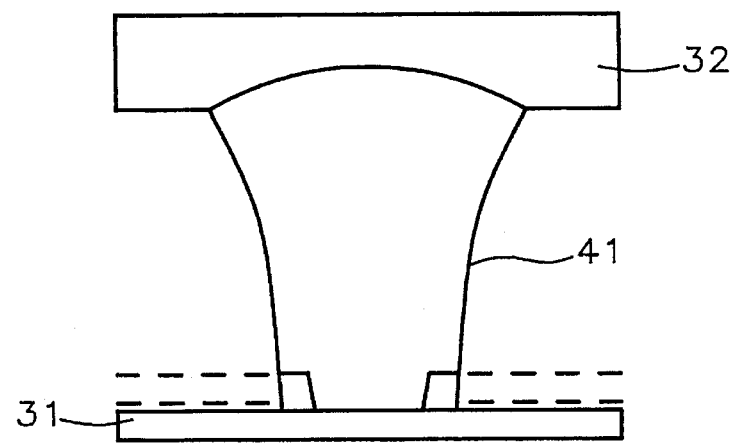

The embodiment illustrated in FIG. 3 shows only a single infrared detector. It is possible to associate a plurality of detectors with a given concavity, such as 46 as illustrated in FIG. 4. Envelope 41 shows the envelope of confinement for the radiation within the cavity. Such multiple detectors may be electrically connected together so as to enhance the sensitivity of a given structure. However, as the radiation makes its eight passes within the confines of the cavity, the presence of material near the center of envelope 41 tends to cause premature dissipation of the beam's energy prior to the completion of all eight passes so, in an alternative embodiment of the invention, the detectors are confined to the outer edges of radiation envelope 41. This is illustrated in FIG. 5.

Figure 6:
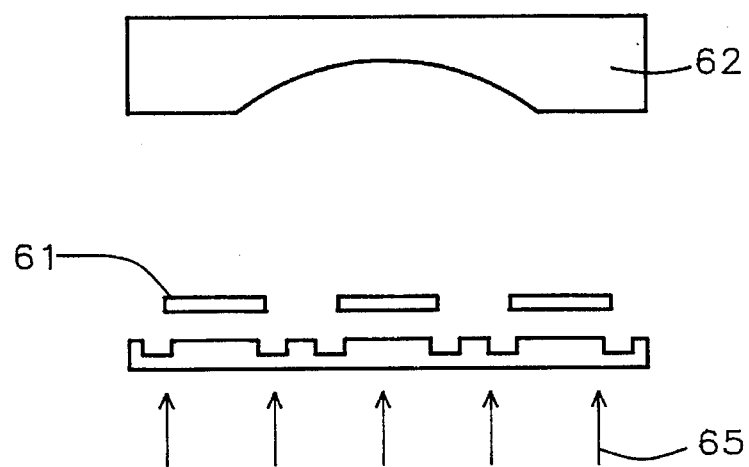
FIG. 6 shows an embodiment of the present invention that can be tailored to respond to radiation in only a narrow band.

FIG. 6 shows an embodiment that has been optimized for fine wavelength tuning. Many detectors, such as 61, share a single resonant cavity (not shown) containing a single concavity 62. At the wavelength for which the device has been designed (and multiples thereof) trapped radiation, that originally entered at 65, will be accumulated to fall on the detectors, otherwise it will be spread out within the cavity.

Figure 7:
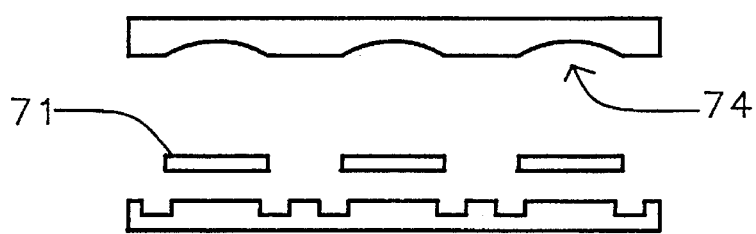
FIG. 7 shows an embodiment of the present invention that can be tailored to respond to radiation over a wide range of wavelengths.

The embodiment shown in FIG. 7 is intended to achieve higher spacial resolution by the image detector. Each of the detectors, such as 71, has its own concavity, such as 74, so the spatial resolution of this embodiment is much higher than that of the previous device shown in FIG. 6. It could thus be used as part of an array with each of the individual detectors serving as a single pixel measuring about 10 microns across.

Figure 8:
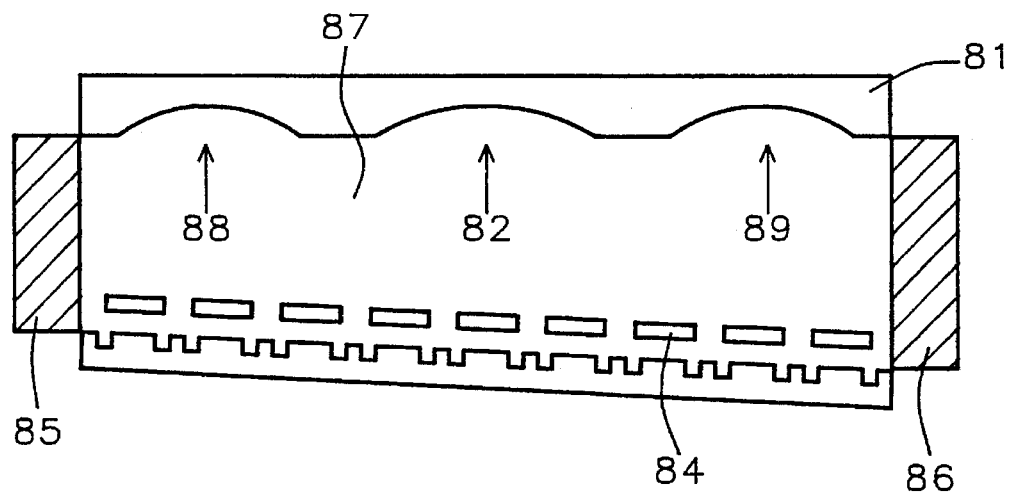
FIG. 8 shows an embodiment of the present invention that can be tailored to detect radiation in several narrow wavelength bands simulataneously.

FIG. 8 shows an embodiment which is, in effect, a merging of the embodiments shown in FIGS. 6 and 7. Top plate 81 includes three concavities, such as 82, each of which is associated with three detectors of its own, such as 84, which all share bottom plate 83. Two of the opposite spacers, 85 and 86, of the cavity 87 have intentionally been given different dimensions. For example, in one embodiment spacer 85 measured about 35 microns while spacer 86 measured about 37 microns. This caused plate 81 to lie at an angle (typically between about 1° and 4° of arc) relative to plate 83 so that the effective distance between the plates varied from about 40 microns at the center of concavity 88 to about 42 microns at the center of concavity 89. As a result, the three concavities were tuned for different wavelengths: concavity 88 for 14.54, 13.91, 13.33, etc. microns, concavity 82 for 14.90, 14.26, 13.66, etc. microns, and concavity 89 for 14.60, 14.00, 13.44, etc. microns. In general, the mean spacing between the non-parallel plates could be anything in the range of from about 15 to 50 microns. Such a design makes possible the analog of color imaging for infrared.

We will now describe the manufacturing process for the embodiment shown in cross-section in FIG. 8 in greater detail: To describe the preparation of the upper and lower silicon plates 81 and 83, it is convenient to refer once again to FIG. 3 where these plates are designated as 32 and 31 respectively.

A concavity is formed in the lower surface of top plate 32 by first forming a cylindrically shaped trench by means of electron bombardment and then isotropically etching said trench. The etchant acts more slowly where the circular and planar walls of the trench meet, the net result being to remove sharp corners and generate an approximately sherical concavity. The lower surface, including the concavity, is then coated with a layer of aluminum to a thickness between about 0.5 and 1.3 microns. This renders said lower surface fully reflective.

The preparation of bottom plate 31 begins by roughening its lower surface by means of sand blasting (or equivalent) to a roughness value between about 10 and 50 microns. Then a layer of thermal silicon oxide 30 is grown on the upper surface of the bottom plate. Layer 30 is then coated with layer 35 which comprises gold, molybdenum, or tungsten and has a thickness of about 50 nanometers. Layer 35 has a reflectance that is slightly less than 100%, while still having a small, but non-zero, transmittance. Layer 35 is then patterned and etched into approximately square areas that roughly correspond in size and location to concavities 34 in top plate 32.

Next, a second layer of silicon oxide 37 is deposited in a rectangular shape over the layer 35 areas by chemical vapor deposition to a thickness between about 1.8 and 2.5 microns. It is then itself patterned and etched into slightly larger areas than the concavities, symmetrically overlapping the layer 35 areas. The purpose of layer 37 is to serve as a sacrificial layer, as will be seen shortly.

This is followed by the deposition of silicon nitride layer 38 with a thickness of between about 2 and about 5 microns. After heating at around 1,000° C. for a few minutes, to achieve stress relief, a layer of resistive material 36, comprising chromium or titanium oxide, is deposited onto layer 38 and then patterned and etched to form a resistor having a typical serpentine shape. A layer of aluminum is then deposited, patterned, and etched to form wiring pads 101, which contact the ends of the resistors and connect them to external terminals.

The final layer to be deposited at this stage of the process is a second layer of silicon nitride 39 having a thickness between about 900 and 1,100 Angstrom units. Layer 39 covers the entire exposed surface and will serve both as a protective layer as well as to prevent shorting between wiring pads 101 by the metallic spacers (to be described below).

The two layers of silicon nitride 36 and 38 are now patterned and etched to form a support platform for the resistor as well as supportive legs for said platform. This can be seen in the plan view shown in FIG. 3b. FIG. 3a can be seen to be a jagged cross-section (3a–3a) taken through FIG. 3b. Sacrificial silicon oxide layer 37 is now selectively removed by etching in hydrofluoric acid. This releases the platform so that it becomes free-standing, thereby isolating it from thermal contact with all surfaces other than its own supportive legs.

This completes preparation of the top and bottom plates and lays the way for their assembly. This is shown in FIGS. 10 through 13. Assemblages of the type shown in FIG. 3 or FIG. 8 are, of course, located between the two plates but have been omitted from the diagrams for simplification purposes. Similarly, most of the wiring pads 101 have also been omitted except for a couple of examples in FIG. 10.

Figures 9, 10:
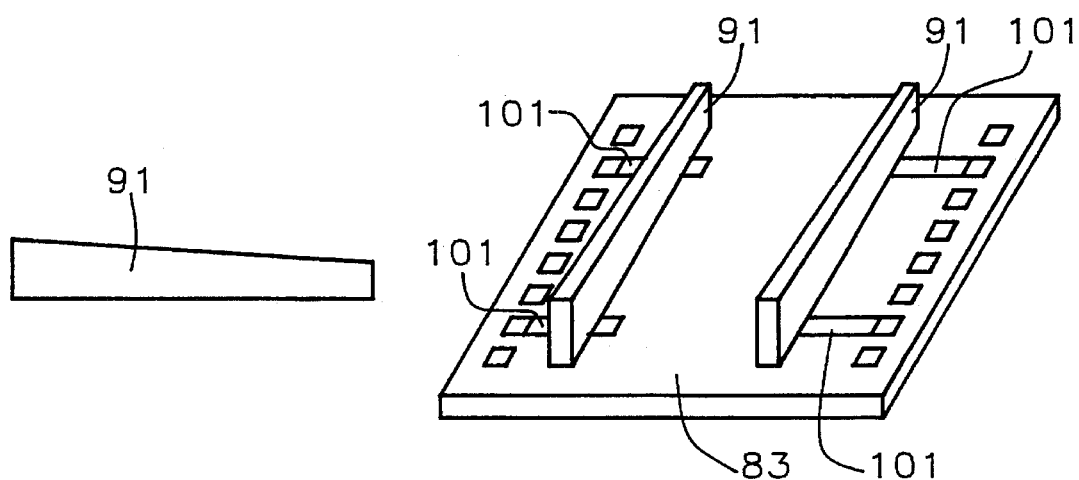
FIGS. 9–13 illustrate the various steps that are followed in the manufacture of the embodiment shown in FIG. 8.
Figure 11:
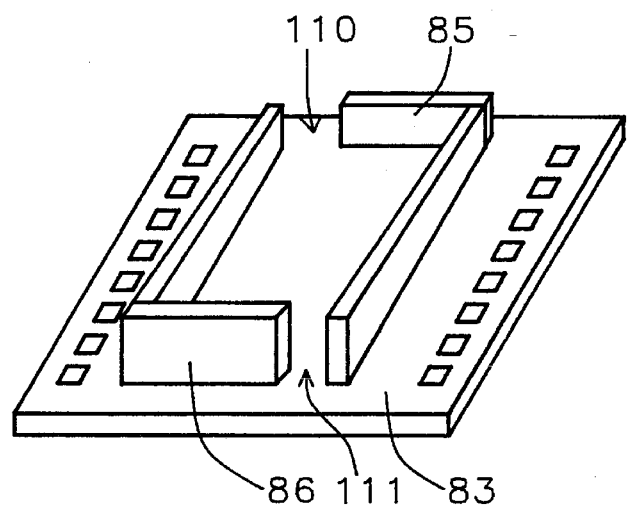

Support spacers, such as 91 in FIG. 9 are now formed, in pairs, on the top surface of bottom plate 83 as shown in FIG. 10. Said spacers comprise an alloy of nickel and iron and are electroformed in photoresist molds. The alloy typically comprises about 37% nickel and about 63% iron, being selected because it has a near-zero coefficient of thermal expansion. As seen in FIG. 11, a second pair of spacers 85 and 86 are now formed in a similar manner so that a four walled enclosure results. Note that two openings 110 and 111 have been left so that the enclosure can be evacuated.

Figure 12:
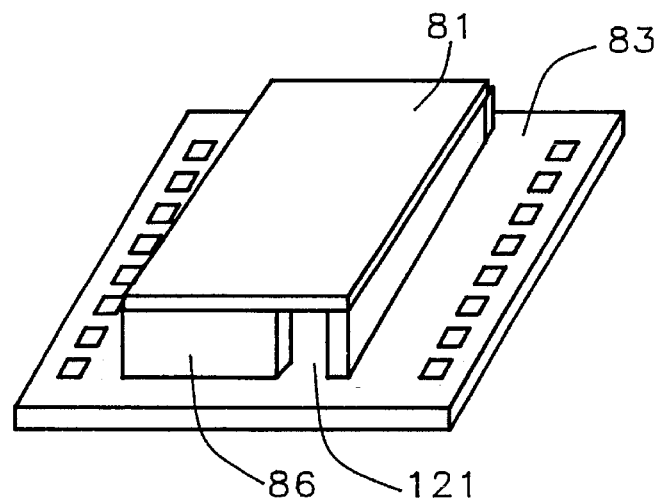
Figure 13:
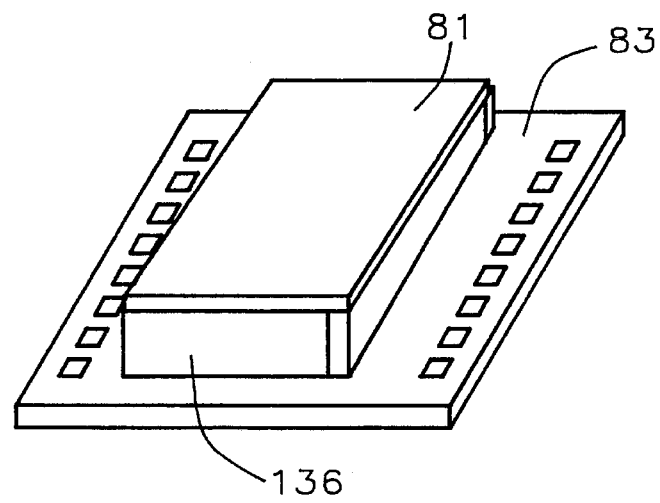

With the enclosure in place, top plate 81 is carefully aligned with respect to plate 83 so that the centers of the concavities and the centers of the resistor bearing platforms line up, following which the two plates and the spacers are fused together, producing the structure shown in FIG. 12. This is then evacuated and, while still under vacuum, the openings in the enclosure (one of which, 121, is shown in FIG. 12) are sealed. Sealing may be accomplished using either epoxy resin or fired glass frit. The former is somewhat more convenient to use but does not lead to as good a final vacuum inside the enclosure as does the fired frit. The completed assembly now has the appearance shown in FIG. 13. Front wall 136 is original spacer 86 after opening 121 has been sealed.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing an infrared radiation detection device comprising:

providing top and bottom plates of silicon, each plate having upper and lower surfaces;

forming a concavity in the lower surface of said top plate and coating said lower surface, including the concavity, with a layer of material that renders said lower surface fully reflective;

roughening the lower surface of said bottom plate;

forming a first layer of silicon oxide on the upper surface of said bottom plate;

coating said first layer of silicon oxide with a layer of material having non-zero transmittance and a reflectance that is slightly less than unity;

depositing a second layer of silicon oxide on said reflecting material then patterning and etching said second layer of silicon oxide into a rectangular shape that is slightly larger than said concavity;

depositing a first layer of silicon nitride then heating said bottom plate to achieve stress relief;

depositing a layer of resistive material on said first layer of silicon nitride and then patterning and etching said resistive layer to form a resistor having two ends;

depositing, patterning, and etching a layer of conductive material to form contact pads to said resistor, one pad for each end of the resistor;

depositing a second layer of silicon nitride for protective purposes;

patterning and etching said first and second layers of silicon nitride to form a support platform for the resistor and supportive legs for said platform;

selectively removing said second layer of silicon oxide, thereby limiting thermal contact to the platform to said supportive legs;

forming support spacers on the upper surface of said bottom plate;

aligning the center of the concavity with the center of the platform and then attaching the lower surface of the top plate to the support spacers thereby forming an enclosure for said concavity and platform; and evacuating said enclosure and then sealing it under vacuum.

2. The method of claim 1 wherein forming said concavity further comprises:

forming a cylindrically shaped trench by means of electron bombardment; and isotropically etching said trench so as to remove sharp corners.

3. The method of claim 1 wherein the roughening of the lower surface of said bottom plate is achieved by means of sand blasting to a roughness value between about 10 and 50 microns.

4. The method of claim 1 wherein said first layer of silicon oxide is formed by thermally oxidising the upper surface of said bottom plate.

5. The method of claim 1 wherein said high reflectance, non-zero transmittance material comprises one of gold or molybdenum, or tungsten having a thickness of about 50 nanometers.

6. The method of claim 1 wherein said second layer of silicon oxide is deposited by chemical vapor deposition to a thickness between about 1.8 and 2.5 microns.

7. The method of claim 1 wherein the thickness of said first layer of silicon nitride is between about 2 and about 5 microns.

8. The method of claim 1 wherein said resistive material comprises chromium or titanium oxide.

9. The method of claim 1 wherein the thickness of said second layer of silicon nitride is between about 900 and about 1,100 Angstrom units.

10. The method of claim 1 wherein said spacers comprise an alloy of nickel and iron and are formed by means of electroforming in photoresist moulds.

11. The method of claim 10 wherein said alloy comprises about 37% nickel and about 63% iron.

12. The method of claim 1 wherein the selective removal of said second layer of silicon oxide is achieved by etching with hydrofluoric acid.

13. The method of claim 1 wherein the step of sealing under vacuum is achieved by use of epoxy or glass frit.

* * * * *